United States Patent
Ishii et al.

(10) Patent No.: US 6,545,322 B2
(45) Date of Patent: Apr. 8, 2003

(54) SEMICONDUCTOR PROTECTION DEVICE

(75) Inventors: Kazutoshi Ishii, Chiba (JP); Toshihiko Omi, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/998,943

(22) Filed: Oct. 31, 2001

(65) Prior Publication Data

US 2002/0063290 A1 May 30, 2002

(30) Foreign Application Priority Data

Nov. 1, 2000 (JP) .................................... 2000-334644
Feb. 14, 2001 (JP) .................................... 2001-037299
Sep. 28, 2001 (JP) .................................... 2001-301121

(51) Int. Cl.$^7$ ............................................... H01L 23/62
(52) U.S. Cl. ........................................ 257/360; 257/355
(58) Field of Search ................................ 257/355, 356, 257/360

(56) References Cited

U.S. PATENT DOCUMENTS 5,760,445 A  *  6/1998  Diaz ........................... 257/356
6,258,672 B1 *  7/2001  Shih et al. .................. 438/275

FOREIGN PATENT DOCUMENTS

JP        11195783 A  *  7/1999  ........... H01L/29/78

* cited by examiner

Primary Examiner—Allan R. Wilson
(74) Attorney, Agent, or Firm—Adams & Wilks

(57) ABSTRACT

There is provided a semiconductor integrated circuit device with high electrostatic resistance. A semiconductor device is provided with a transistor for input-output protection having a desired size in which its channel length is varied with respect to a channel width direction.

18 Claims, 11 Drawing Sheets

SEMICONDUCTOR PROTECTION DEVICE

BACKGROUND OF THE INVENTION

1. Field of the Invention

The present invention generally relates to a semiconductor integrated circuit device. More particularly, the present invention relates to a field-effect semiconductor integrated circuit, in particular, ICs for a voltage regulator for step-up and down voltage, for voltage control, for liquid crystal drive, for thermosensible paper resistor drive, and the like.

2. Description of the Related Art

In a conventional semiconductor integrated circuit device shown in FIG. 3, there are provided a relatively long second minimum distance 22, a relatively long third minimum distance 23, and a relatively short first minimum distance 21. The second minimum distance 22 is a distance between a gate electrode 11 side end in a channel length direction of a drain region 10 of a transistor composing an input-output circuit and an end of a contact region 12 that electrically connects the drain region 10 and a metal electrode 14. The third minimum distance 23 is a distance between an end on the opposite side to the gate electrode 11 in the channel length direction and an end of the contact region 12 that electrically connects the drain region 10 and the metal electrode 14. The first minimum distance 21 is a distance between an end in a channel width direction of the drain region 10 of the transistor composing the input-output circuit and an end of the contact region 12 that electrically connects the drain region 10 and the metal electrode 14.

FIG. 2 shows an example of a transistor for an input-output circuit of a conventional semiconductor integrated circuit device. FIG. 2 is a plan view of an insulated-gate field-effect transistor.

In the transistor shown in FIG. 2, each of a drain region 10 and a source region 13, which are electrically isolated from each other by a gate electrode 11 connected electrically to metal electrodes 14 and 15 is provided with contact regions 12, and the drain region 10 and the source region 13 are electrically connected to the metal electrodes 14 and 15, respectively. Thus, desired electrical characteristics are obtained.

Since this transistor is connected directly to an input-output terminal 36, external noise is applied directly to the transistor. Hence, the transistor has a characteristic of excellent external noise immunity. Conventionally, as a technique for obtaining this, it has been well known to increase a second minimum distance 22, to increase a channel width, or to reduce the channel width.

In a semiconductor integrated circuit device shown in FIG. 4, a relatively long first minimum distance 21 is provided in a transistor used in an input-output circuit of a semiconductor integrated circuit composed of a plurality of field-effect transistors. The first minimum distance 21 is a distance between an end in the channel width direction of a drain region 10 and an end of a contact region 12 that electrically connects the drain region 10 and a metal electrode 14.

FIG. 4 is a plan view of the transistor composing an input-output circuit of a semiconductor integrated circuit device.

In the transistor shown in FIG. 4, each of the drain region 10 and a source region 13, which are electrically isolated from each other by a gate electrode 11 is provided with contact regions 12, and the drain region 10 and the source region 13 are electrically connected to the metal electrodes 14 and 15, respectively. Thus, desired electrical characteristics are obtained.

Since this transistor is connected directly to an input-output terminal 36, external noise is applied directly to the transistor. Hence, the transistor has a characteristic of excellent external noise immunity.

In this case, since the first minimum distance 21 is provided so as to be longer than a second minimum distance 22 and a third minimum distance 23, localization of overcurrent generated when electrostatic noise is applied to the drain region 10 is relieved. Thus, breakdown of the transistor due to local heat generation can be suppressed. Here, the first minimum distance 21 is a distance between the end in the channel width direction of the drain region 10 and an end of a contact region 12 that electrically connects the drain region 10 and the metal electrode 14. The second minimum distance 22 is a distance between a gate electrode 11 side end in the channel length direction of the drain region 10 and an end of the contact region 12 that electrically connects the drain region 10 and the metal electrode 14. The third minimum distance 23 is a distance between the end on the opposite side to the gate electrode 11 in the channel length direction and an end of the contact region 12 that electrically connects the drain region 10 and the metal electrode 14.

Conventionally, as a technique for achieving this, it has been well known to increase the second minimum distance 22 or to increase the channel width. In the conventional technique, however, in order to obtain practically preferable electrostatic resistance, for example, a total width of transistors electrically connected to the same input-output terminal had to be at least about 200 $\mu$m even when the second minimum distance 22 between the gate electrode 11 side end in the channel length direction of the drain region 10 and an end of the contact region 12 in the drain region 10 and the third minimum distance 23 between the end on the opposite side to the gate electrode 11 and an end of the contact region 12 in the drain region 10 were set to be at least about 7 $\mu$m.

However, when the first minimum distance 21 between the end in the channel width direction of the drain region 10 and an end of the contact region 12 in the drain region 10 was set to be longer than the second and third minimum distances 22 and 23, it was possible to reduce the total channel width of the transistors electrically connected to the same input-output terminal to 140 $\mu$m or less even when the second and third minimum distances 22 and 23 were about 7 $\mu$m. It also is possible to reduce the total channel width to about 120 $\mu$m or less, or about 100 $\mu$m or less, although it also depends on differences in mounting conditions or in device constructions and manufacturing process configurations. In addition, this effect further increases when the first minimum distance 21 is set to be longer than the second and third minimum distances 22 and 23 by about 1 $\mu$m. Furthermore, in the case where the phenomenon determining a static drain withstand voltage of this transistor is junction breakdown that occurs between the drain and the semiconductor substrate region 1, the influence of the relationship between the first minimum distance 21 and the third minimum distance 23 on the electrostatic resistance further increases. When the phenomenon determining a static drain withstand voltage of this transistor is surface breakdown caused by the gate electrode 11, the influence of the relationship between the first minimum distance 21 and the second minimum distance 22 on the electrostatic resistance further increases.

In the above, examples were described that were effective when power supply voltage is about 3 V or lower, about 5

V or lower, or about 7 V or lower. However, this technique provides the same effect when the power supply voltage is between about 7 V and about 40 V. In addition, a similar effect can be obtained even when the power supply voltage is about 40 V or higher.

However, for example, in the case of a transistor with a LDD structure having a side spacer on a side wall of a gate electrode 11 used when the power supply voltage or an applied electric field is high, the electrostatic resistance may increase in some cases when the second and third minimum distances 22 and 23 rather than the first minimum distance 21 are set to be longer.

This effect further increases when the static drain withstand voltages at the four peripheral sides of the drain region 10 are approximately in the same level.

Furthermore, it has been known that when electrostatic noise is applied, electric charges generated by the noise are allowed to escape to ground potential by a parasitic bipolar transistor composed of a drain region 10, a semiconductor substrate region 1, and a source region 13. This technique provides a large effect by increasing the distance between the contact region 12 and an end of the drain region 10 in the vicinity of the parasitic bipolar transistor whose current capacity at which breakdown occurs is small. Such an effect becomes prominent when the power supply voltage is between 20V and 40V.

In other words, the principle of this technique resides in preventing overcurrent from flowing locally through a region with high resistance when electrostatic noise is applied.

However, the conventional semiconductor integrated circuit device had the following problems.

That is, in the case of the insulated-gate field-effect semiconductor device shown in FIG. 2, in order to obtain desired noise immunity (including electrostatic resistance), the channel width was required to be designed to be larger and thus it was difficult to reduce the chip size as a semiconductor integrated circuit device.

In addition, when there were many input-output terminals, an increased chip size as a semiconductor integrated circuit device caused a considerable increase in manufacturing cost.

Furthermore, in the case of the insulated-gate field-effect semiconductor device shown in FIG. 4, even when the first minimum distance 21 between the end in the channel width direction of the drain region 10 and an end of the contact region 12 that electrically connects the drain region 10 and the metal electrode 14 is set to be longer, the total channel width of the transistors electrically connected to the same input-output terminal has to be 140 ìm or less. Hence, it was difficult to reduce the chip size as a semiconductor integrated circuit device.

SUMMARY OF THE INVENTION

In order to solve the above-mentioned problems, the following measure is taken.

According to the present invention, there is provided a semiconductor device comprising a semiconductor integrated circuit composed of a plurality of MOS field effect transistors, in which the semiconductor integrated circuit includes an NMOS transistor protection device with a longer channel length on an input-output terminal side than that on an opposite side to the input-output terminal side.

In addition, in the semiconductor device, an NMOS transistor protection device is employed, whose channel length is reduced in two steps from the input-output terminal side to the opposite side to the input-output terminal side.

Further, in the semiconductor device, an NMOS transistor protection device is employed, whose channel length is reduced in three steps from the input-output terminal side to the opposite side to the input-output terminal side.

Still further, in the semiconductor device, an NMOS transistor protection device is employed, whose channel length is reduced smoothly in a curvilinear form from the input-output terminal side to the opposite side to the input-output terminal side.

Yet further, in the semiconductor device, an NMOS transistor protection device is employed, whose channel length on an input-output terminal side is 3.1 $\mu$m or shorter.

Furthermore, in the semiconductor device, an NMOS transistor protection device is employed, whose channel length on an input-output terminal side is 1.2 $\mu$m or longer.

Moreover, in the semiconductor device, an NMOS transistor protection device is employed, whose channel length on an input-output direction side is 1.8 $\mu$m or longer.

Furthermore, in order to increase hfe of a portion where bipolar operation is difficult to occur so that the parasitic resistance component of the portion where bipolar operation is difficult to occur can be cancelled, and in addition, to increase hfe of the portion where bipolar operation is difficult to occur so that the distribution of carriers injected from a source region also can be cancelled, a semiconductor device is provided, in which an NMOS transistor protection device is employed, whose channel length is varied smoothly from the input-output terminal side to the opposite side to the input-output terminal side so that uniform bipolar operation occurs over the whole channel.

DETAILED DESCRIPTION OF THE PREFERRED EMBODIMENTS

Examples of the present invention will be described with reference to the drawings as follows.

Figure 1:
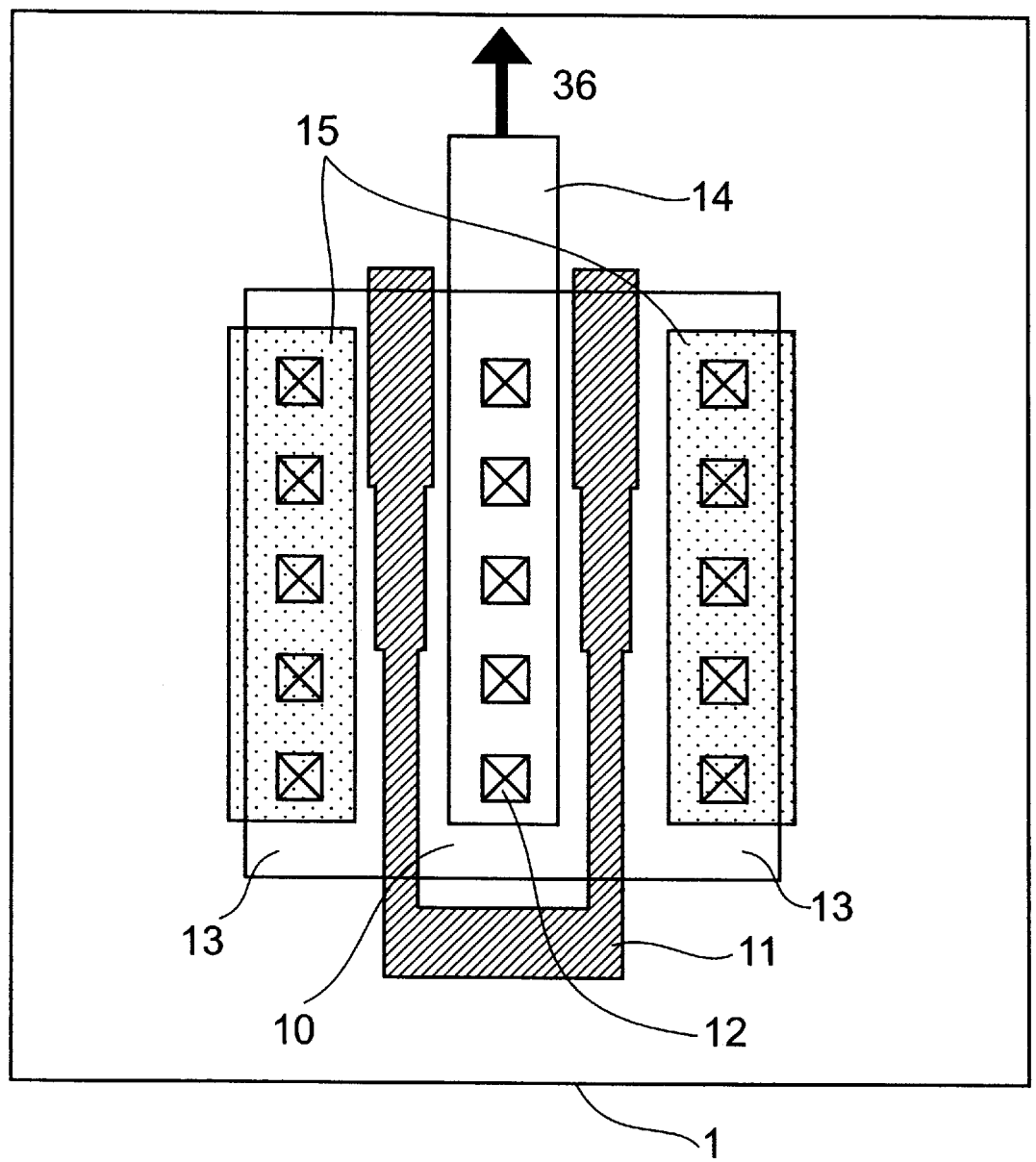
FIG. 1 is a schematic plan view of a semiconductor device according to the present invention.
Figure 2:
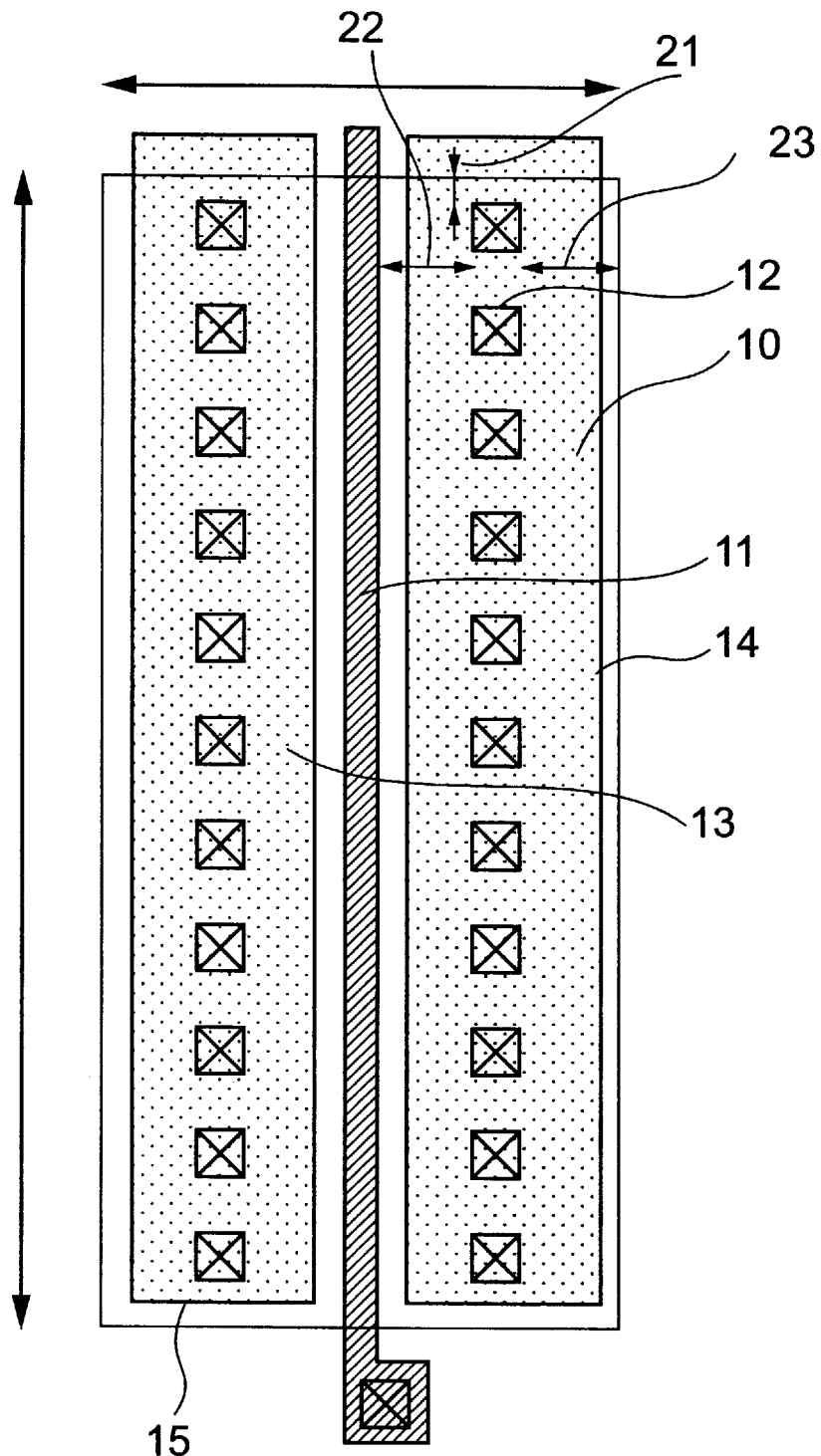
FIG. 2 is a schematic plan view of a conventional semiconductor device.
Figure 3:
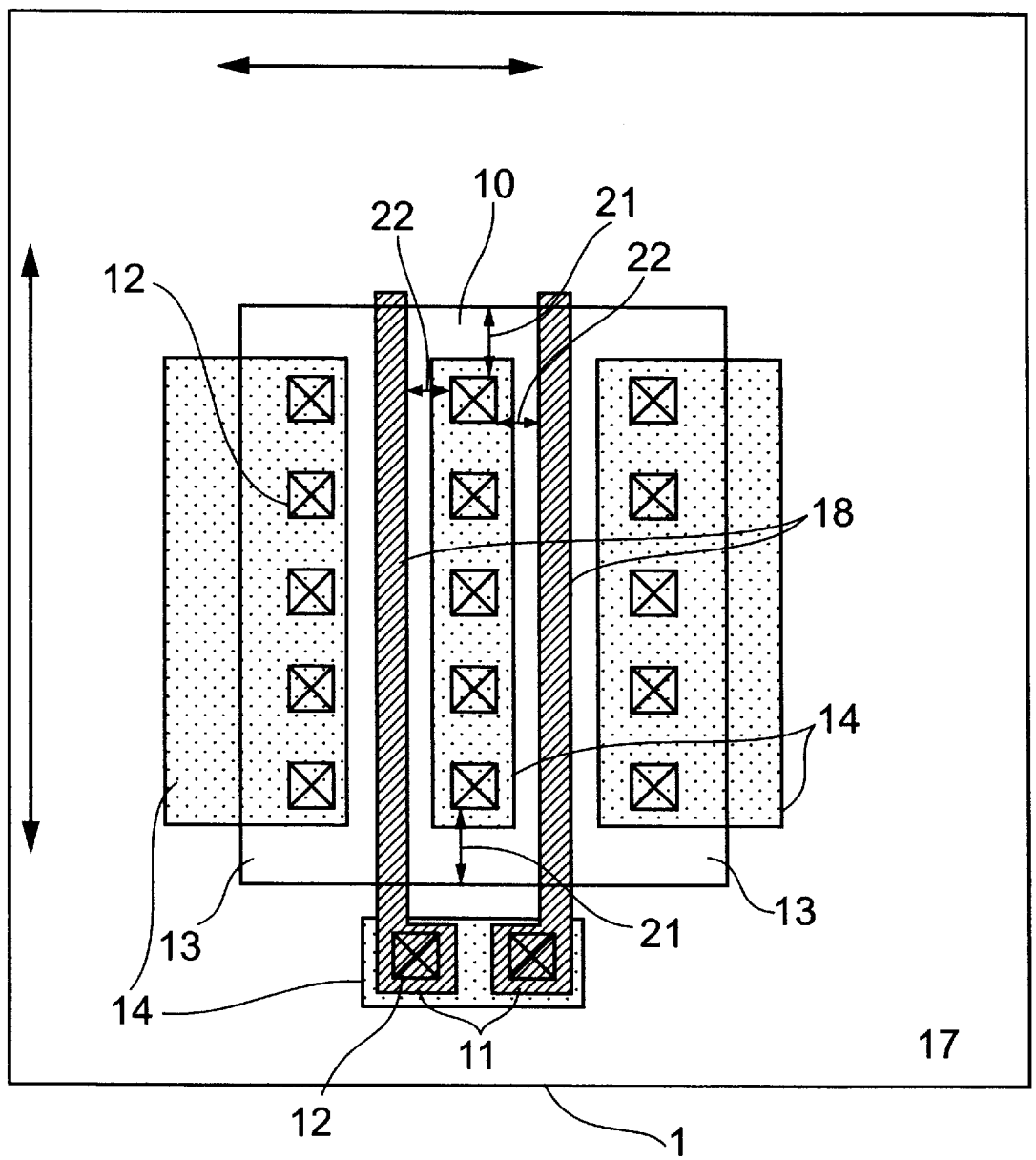
FIG. 3 is a schematic plan view of a conventional semiconductor device.
Figure 4:
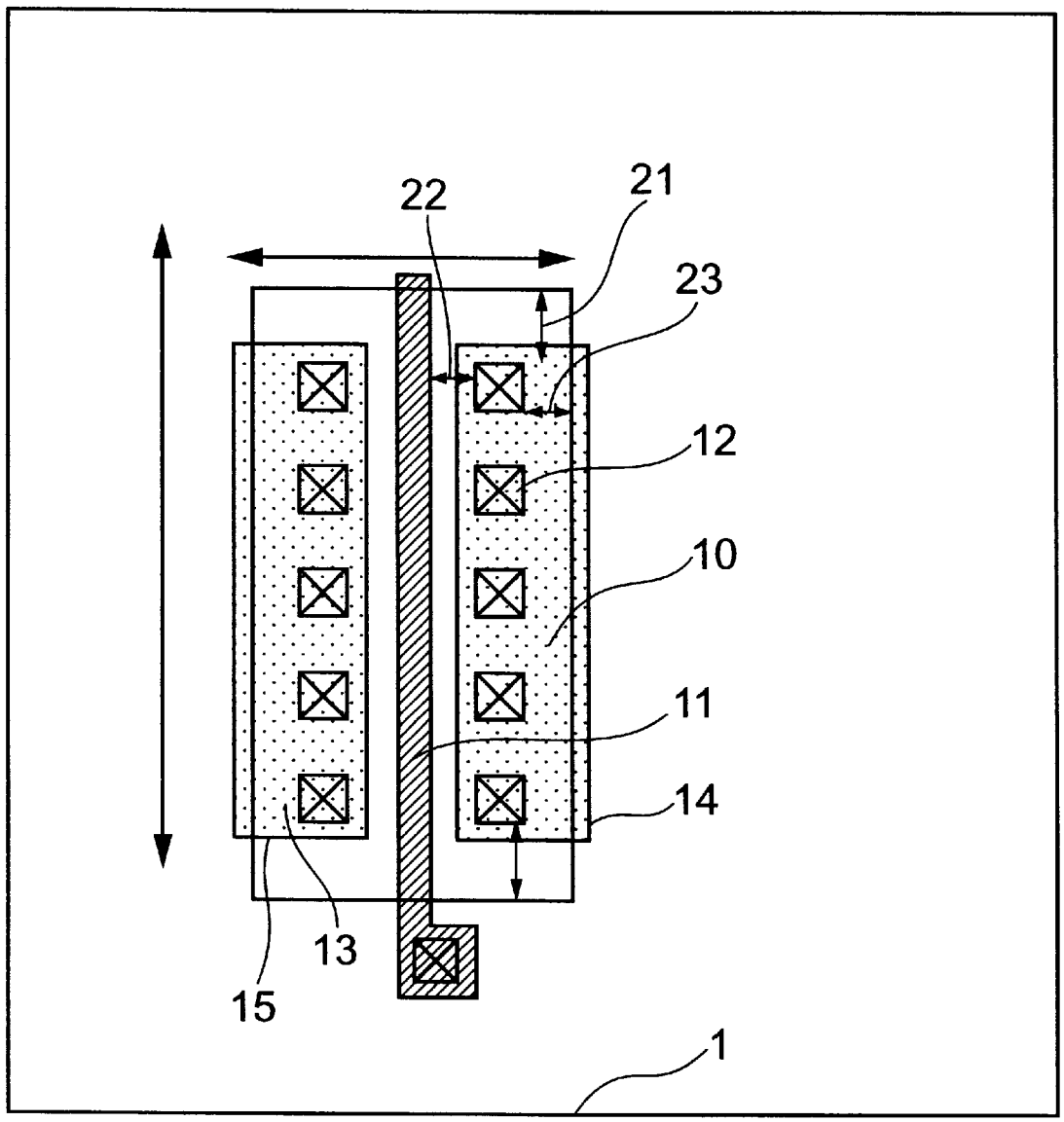
FIG. 4 is a schematic plan view of a conventional semiconductor device.

In a semiconductor integrated circuit device shown in FIG. 1, the channel length is longer on the input-output terminal 36 side (on the side closer to an input-output terminal 36) and shorter on the opposite side to the input-output terminal 36 (on the side further from the input-output terminal 36) in a transistor for electrostatic protection used in an input-output circuit of a semiconductor integrated circuit device including a plurality of field effect transistors.

In the transistor shown in FIG. 1, contact regions 12 are provided for each of a drain region 10 and a source region 13, which are electrically isolated from each other by a gate electrode 11, the drain region 10 and the source region 13 are electrically connected to metal electrodes 14 and 15, respectively, and thus desired electric characteristics are obtained. This transistor has a characteristic of excellent external noise immunity since the transistor is connected directly to the input-output terminal 36 and thus external noise is applied directly to the transistor.

In addition, the gate electrode 11 has a longer channel length on the input-output terminal 36 side (on the side closer to the input-output terminal 36) and a shorter channel length on the opposite side to the input-output terminal 36 (on the side further from the input-output terminal 36). Hence, when external noise is applied and a parasitic bipolar transistor operates, currents are prevented from flowing intensively through the region closest to the input-output terminal 36. This suppresses breakdown of a device caused by local heat generation and thus there is provided a characteristic of further excellent external noise immunity.

Figure 5:
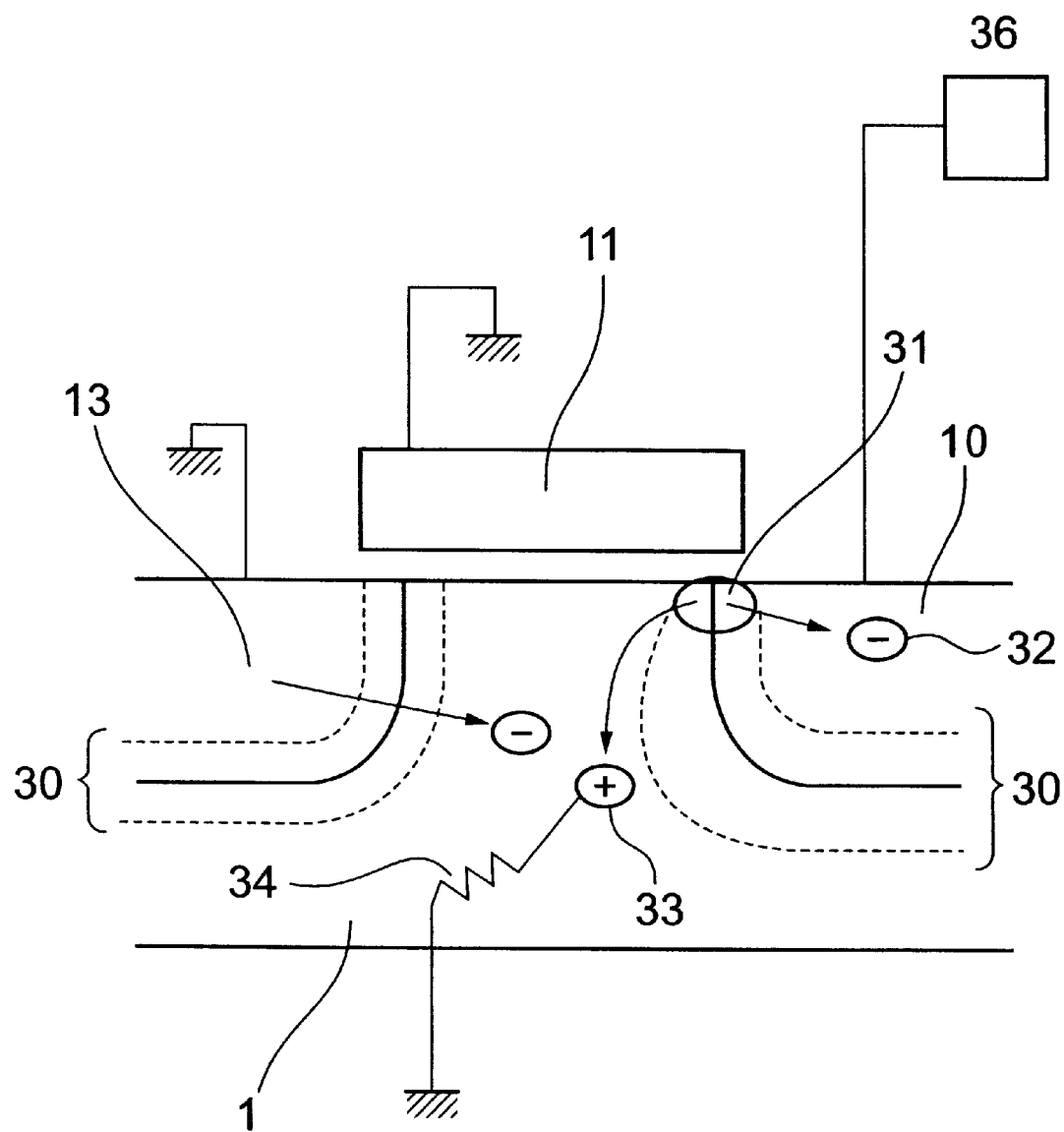
FIG. 5 is a schematic sectional view for explaining an operation of a semiconductor device according to the present invention.

Now, an operation mechanism of the parasitic bipolar transistor is described with reference to the drawings. In FIG. 5, the mechanism by which the parasitic bipolar transistor operates with external noise applied is shown with a schematic sectional view of an NMOS transistor.

When positive electric charges are applied from an input-output terminal 36, a large quantity of electrons 32 and holes 33 are generated from a breakdown region 31 inside a depletion layer 30 in the vicinity of a gate electrode 11, and the holes 33 flow through a semiconductor substrate region 1 to reach ground potential. In this case, since the holes 33 flow through a substrate resistor 34 with a high value of resistance, local positive potential is produced in a part of the semiconductor substrate region 1. This positive potential biases the junction between a source region 13 and the semiconductor substrate region 1 in the forward direction, a large quantity of electrons 32 are injected to the semiconductor substrate region 1 from the source region 13, part of the electrons 32 reaches the breakdown region 31, a larger quantity of electrons 32 and holes 33 are generated, the parasitic bipolar transistor operates, and thus all the charges generated by noises applied from the input-output terminal 36 are carried to the ground potential.

When the part of the electrons 32 injected from the source region 13 reaches the breakdown region 31, the number of electrons 32 that reach the breakdown region 31 increases with the decrease in channel length of the NMOS transistor, and thereby the parasitic bipolar transistor operates easily and a larger quantity of electric charges can be carried to the ground potential.

Figure 6:
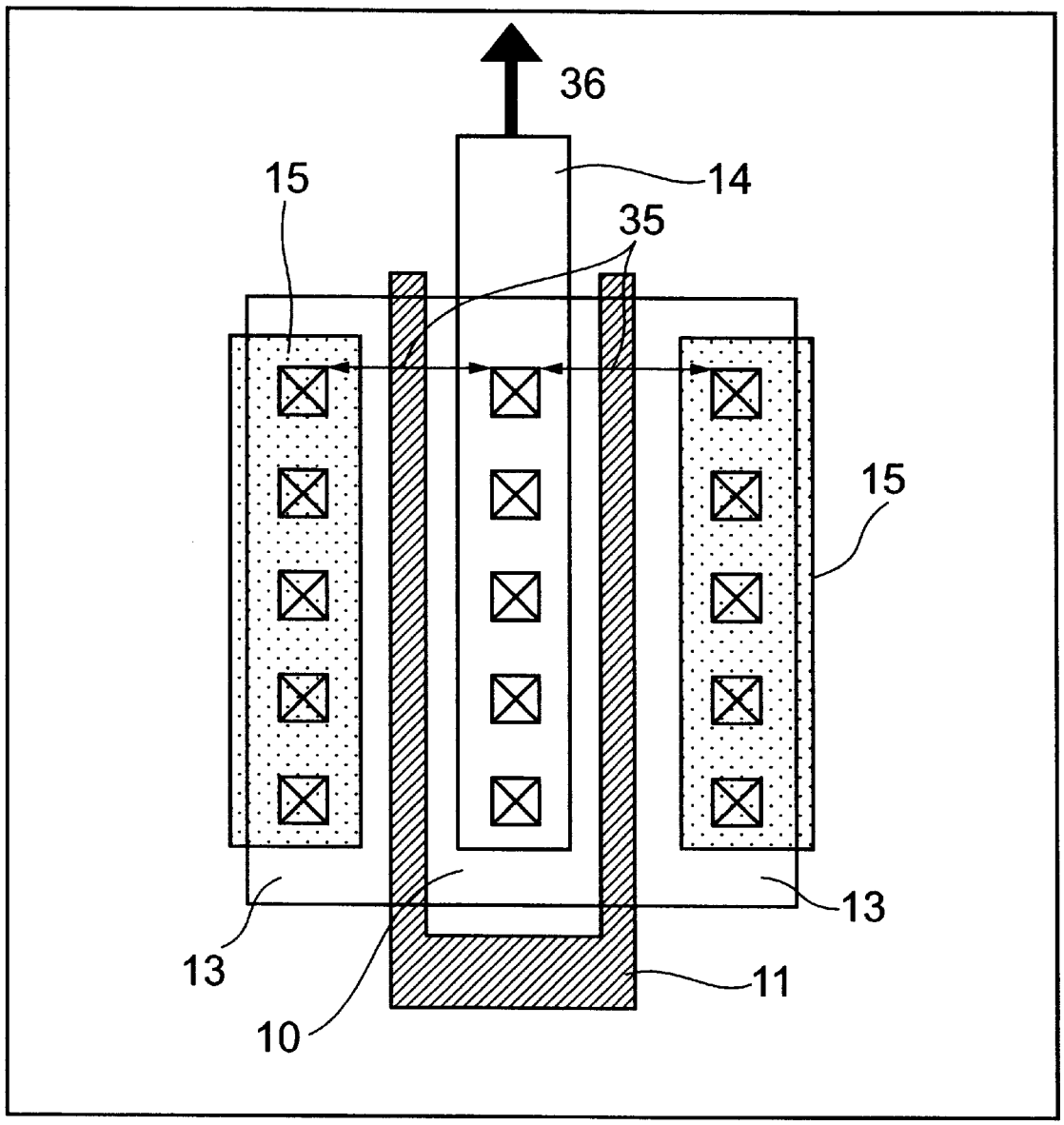
FIG. 6 is a schematic plan view of a conventional semiconductor device.

In this case, a schematic sectional view is shown, which is taken in the channel length direction of the NMOS transistor. As shown in FIG. 6, however, this parasitic bipolar transistor operates locally on the input-output terminal 36 side and tends to generate heat locally to be broken.

Hence, when using the NMOS transistor as shown in FIG. 1, the localization is relieved and thus the resistance to breakdown caused by noise can be improved considerably. In other words, since the parasitic bipolar transistor on the input-output terminal 36 side is made difficult to operate and the parasitic bipolar transistor on the opposite side to the input-output terminal 36 is made easy to operate, as a result, the parasitic bipolar transistors are allowed to operate uniformly over the whole channel width. Hence, the local heat generation is prevented and the resistance to breakdown caused by noise is allowed to improve considerably.

Figure 11:
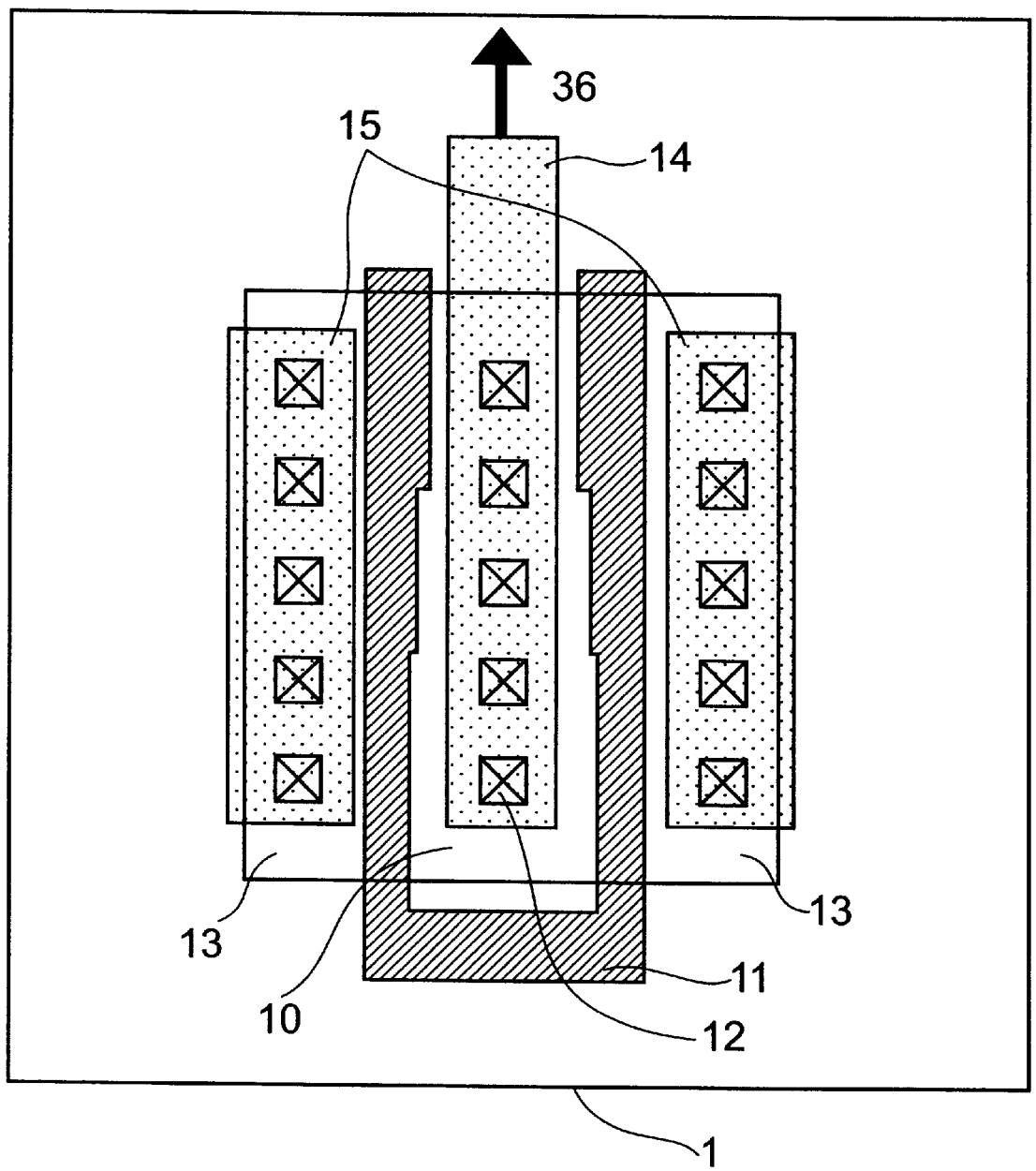
FIG. 11 is a schematic plan view of a semiconductor device according to the present invention.

In FIG. 1, the whole channel width is divided into three regions so that the channel width of the NMOS transistor is varied. As the number of divided regions increases, the parasitic bipolar transistors uniformly operate more easily over the whole channel width. As compared to the conventional case, however, improvement can be expected even when the channel width is divided into two regions. In addition, the effect further increases when the channel length is varied in a smooth curvilinear form. It also is possible to employ the layout as shown in FIG. 11.

Figure 7:
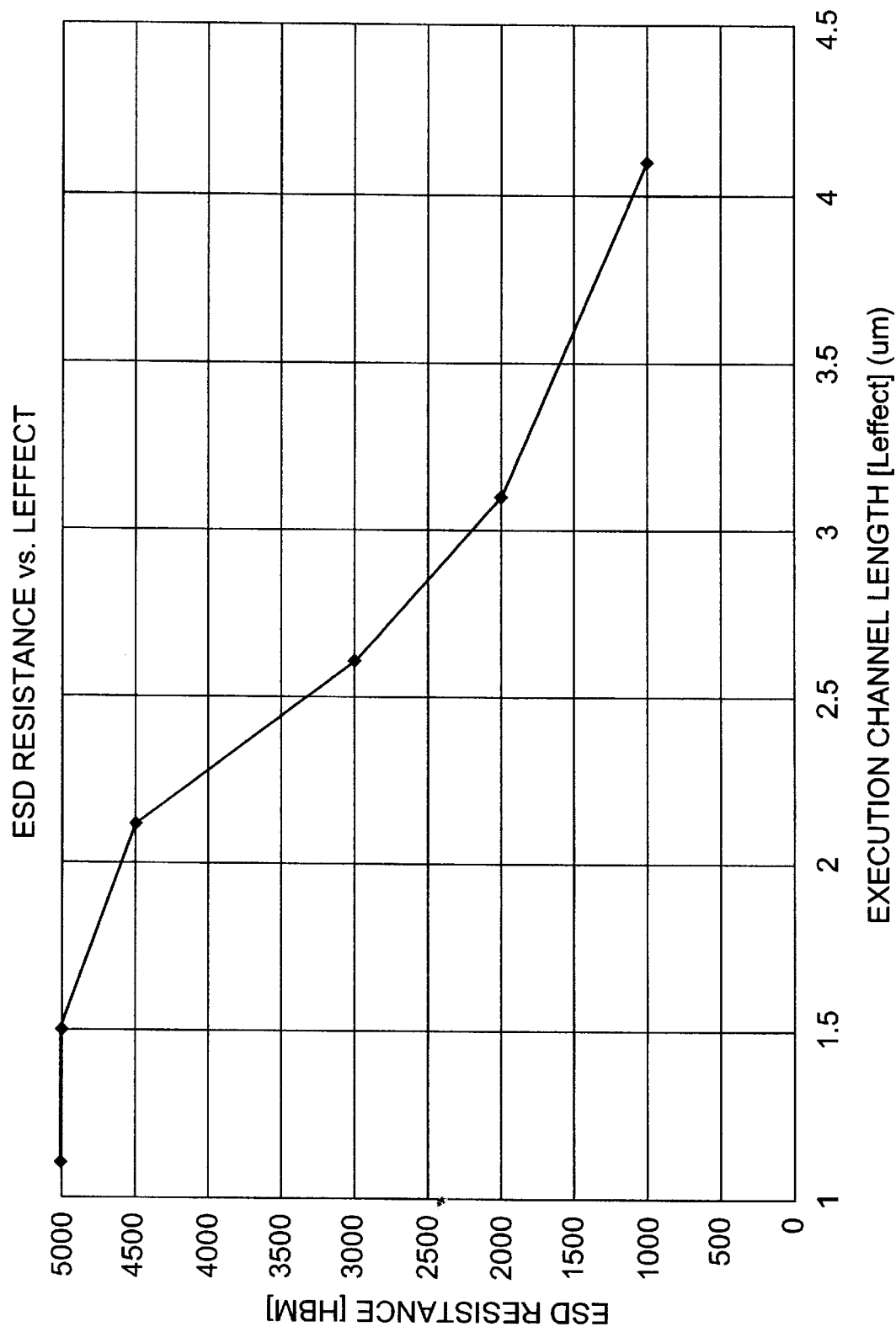
FIG. 7 is a graph showing a characteristic of a semiconductor device according to the present invention.

FIG. 7 shows a characteristic diagram with respect to a channel length and noise immunity (ESD resistance). When the ESD resistance is set to be 2000V in a human body model (HBM), the longest channel length can be set to 3.1 um. Then, the channel length is set to decrease toward the opposite side to the input-output terminal 36. The shortest channel length is set within a tolerance of hold voltage during the bipolar operation or a tolerance of leakage current as a MOS transistor.

Figure 8:
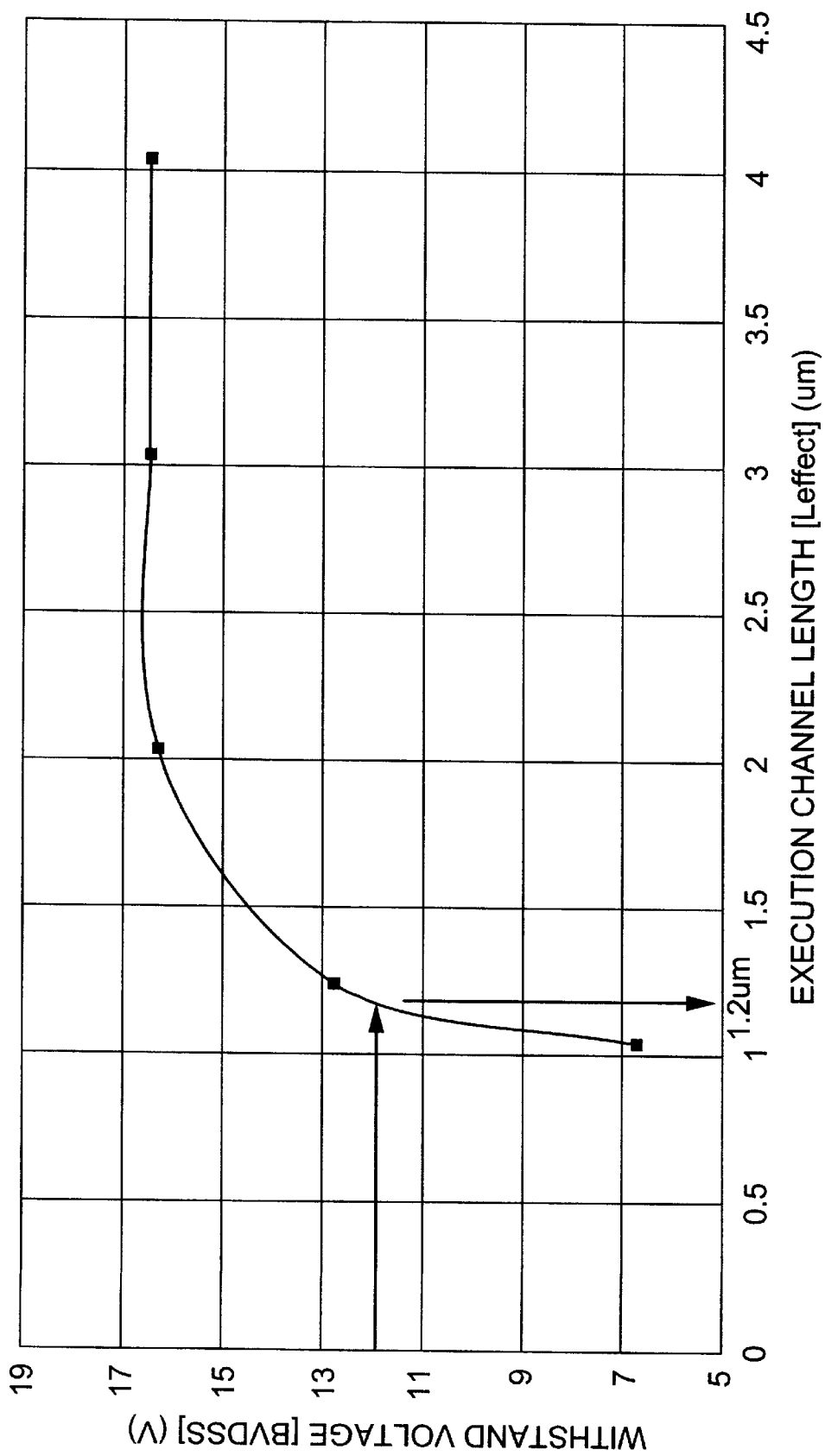
FIG. 8 is a graph showing a characteristic of a semiconductor device according to the present invention.

FIG. 8 shows a characteristic diagram with respect to a channel length and static withstand voltage (BVDSS). When the static withstand voltage is set to be 12V as a withstand voltage (BVDSS) in the case where the gate, source, and substrate potentials are set to the same ground potential (BVDSS), the shortest channel length can be set to 1.2 um. Then the channel length is set to increase toward the input-output terminal 36 side. Thus, the shortest channel length is set within the tolerance of leakage current as the MOS transistor.

Figure 9:
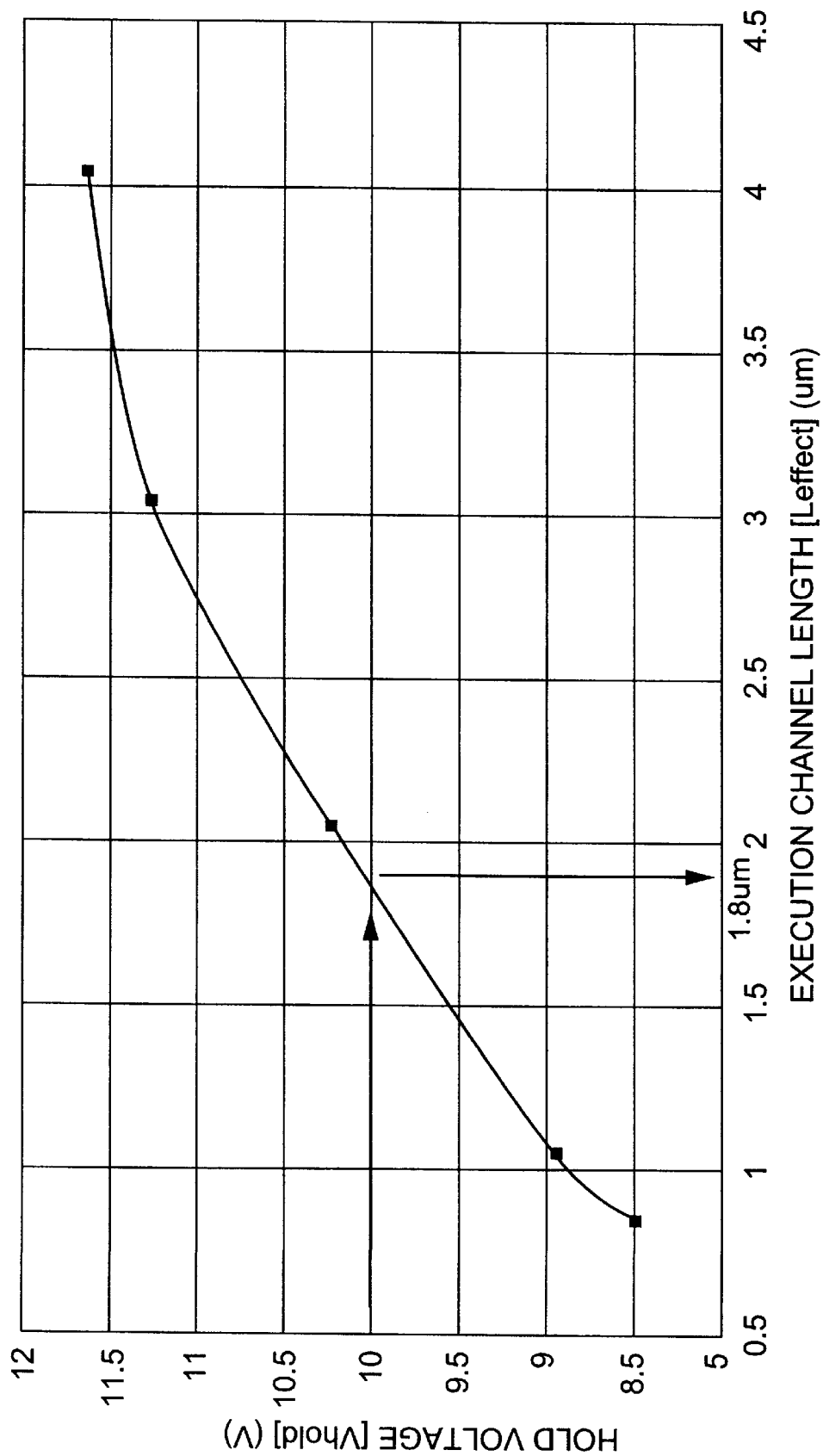
FIG. 9 is a graph showing a characteristic of a semiconductor device according to the present invention.

FIG. 9 shows a characteristic diagram with respect to a channel length and hold voltage (Vhold). When the hold voltage is set to be 10 V as Vhold, the shortest channel length can be set to 1.8 um. Then the channel length is set to increase toward the input-output terminal 36 side. Thus, the shortest channel length is set within a tolerance of the hold voltage (Vhold).

Hence, a suitable setting value is 1.8 um as the shortest channel length that satisfies both the tolerance of the leakage current and the tolerance of the hold voltage (Vhold).

As described with reference to FIGS. 5 and 6, in the conventional transistor, the parasitic bipolar operation occurs in the channel region, the source region 13, and the drain region 10 in the vicinity of the edge on the input-output terminal side. This is because carriers injected from the source region 13 concentrate in the path with a lower source-drain parasitic resistance. Hence, when the channel length of a portion where the bipolar operation does not occur easily (on the opposite side to the input-output terminal 36) is reduced so that a source-drain parasitic resistance (Rsd) of the portion can be cancelled, the bipolar operation occurs easily (on the opposite side to the input-output terminal 36) and thereby uniform bipolar operation can be achieved over the whole channel.

In addition, the substrate current (Isub) causing the parasitic bipolar operation tends to concentrate inevitably in the vicinity of the edge on the input-output terminal 36 side with a low source-drain parasitic resistance in respect of the layout. Thus, the vicinity of the part where the substrate current concentrates becomes the center of the parasitic bipolar operation.

Hence, when the channel length of the portion where the bipolar operation occurs easily (on the input-output terminal 36 side) is increased so that the substrate current (Isub) of the portion also can be cancelled, a further uniform bipolar operation can be achieved over the whole channel.

In other words, the channel length (L) is set with a function of the substrate current (Isub) and the source-drain parasitic resistance (Rsd) so that easiness (H) of occurrence of the parasitic bipolar operation is uniform over the whole channel. The channel length is set by being corrected so that constant H is obtained through the correlation among L, Isub, and Rsd.

Figure 10:
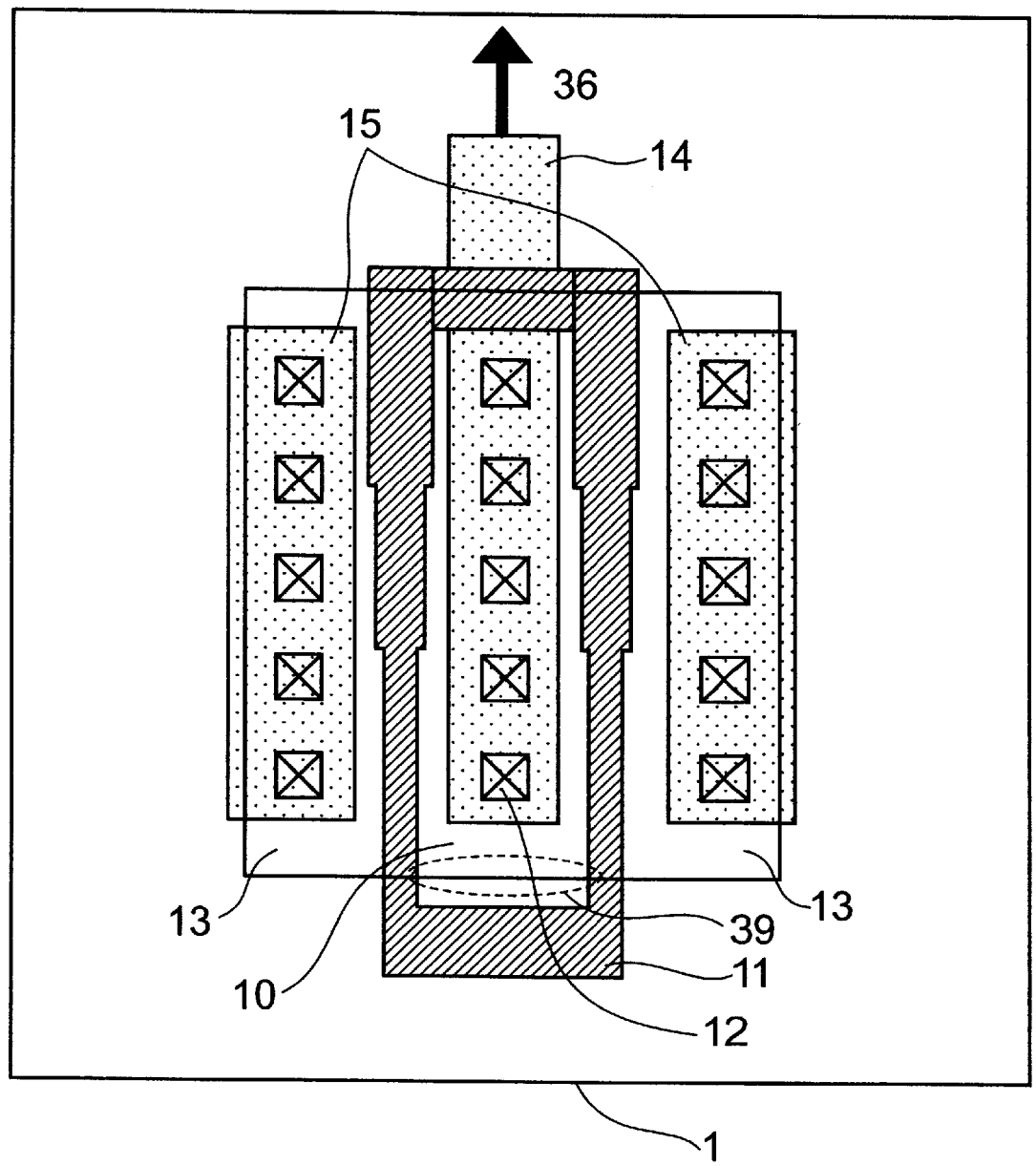
FIG. 10 is a schematic plan view of a semiconductor device according to the present invention.

Besides the invention of varying the channel length described above, there also is a method of varying the generation site and quantity of the substrate current (Isub) as a method of making the easiness (H) of occurrence of parasitic bipolar operation uniform over the whole channel. An example thereof is described with reference to FIG. 10.

In the description of FIG. 5, it was described that "when positive electric charges are applied from an input-output terminal 36, a large quantity of electrons 32 and holes 33 are generated from a breakdown region 31 inside a depletion layer 30 in the vicinity of a gate electrode 11, and the holes 33 flow through a semiconductor substrate region 1 to reach ground potential." This was described with the breakdown region 31 inside the depletion layer 30 in the vicinity of the gate electrode 11 in mind. On the other hand, the following example is directed to a transistor for electrostatic protection in which the above-mentioned breakdown region is replaced by a breakdown region 39 inside a depletion layer between a drain region 10 and a device isolation region 37.

A transistor for electrostatic protection of the present invention is prevented from having the junction between a drain region 10 on the input-output terminal 36 side and a semiconductor substrate 1 region under the device isolation region 37, through the setting in layout. This was achieved since the gate electrode 11 was formed on the region where the junction between the drain region 10 and the semiconductor substrate 1 region under the device isolation region 37 was formed conventionally. On the other hand, the junction between the drain region 10 on the opposite side to the input-output terminal 36 and the semiconductor substrate 1 region under the device isolation region 37 is provided through the setting in layout as in the conventional case. This enables the breakdown region 39 to be produced in the junction part between the drain region 10 on the opposite side to the input-output terminal 36 and the semiconductor substrate 1 region under the device isolation region 37, allows a bipolar operation to occur easily in the vicinity of the end on the opposite side to the input-output terminal 36, and thus improves electrostatic resistance of the transistor for electrostatic protection.

In this case, however, since the site where the breakdown region 39 is produced is relocated, the withstand voltage of the conjunction between the drain region 10 and the semiconductor substrate 1 region under the device isolation region 37 is set to be lower than that inside the depletion layer 30 in the vicinity of the gate electrode 11. For instance, there is a method of increasing impurity concentration in the semiconductor substrate 1 region under the device isolation region 37.

Furthermore, although it is not shown in the figures, it also is possible to change the drain, and source parasitic resistance values in layout through the change of the sites where the contact regions 12 are placed in the drain region 10 and the source region 13, to make the bipolar operation liable to occur in the vicinity of the end on the opposite side to the input-output terminal 36, and to improve the electrostatic resistance of the transistor for electrostatic protection.

In addition, it also is possible to change the potential of the semiconductor substrate 1 in layout, to make the bipolar operation liable to occur in the vicinity of the end on the opposite side to the input-output terminal 36, and to improve the electrostatic resistance of the transistor for electrostatic protection.

As described above, the present invention allows the electrostatic resistance of a transistor for an input-output circuit to be improved in a semiconductor integrated circuit device, so that a highly reliable input-output protection circuit with a narrow channel width can be formed easily. Hence, the present invention provides an effect of reducing manufacturing cost through the reduction in chip size.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes, which come within the meaning and range of equivalency of the claims, are intended to be embraced therein.

What is claimed is:

1. A semiconductor integrated circuit comprising:
   an internal circuit comprised of a plurality of MOS field effect transistors; and
   an NMOS transistor protection device connected between an input-output terminal of the integrated circuit and the internal circuit for protecting the internal circuit, and having a channel with a first end proximate the input-output terminal and a second end opposite the first end in a channel width direction, the channel length being varied from the first end to the second end and being longest at the first end and shortest at the second end.

2. A semiconductor device according to claim 1; wherein the channel length of the NMOS transistor protection device is reduced in two steps from the first end to the second end in the channel width direction.

3. A semiconductor device according to claim 1; wherein the channel length of the NMOS transistor protection device is reduced in three steps from the first end to the second end in the channel width direction.

4. A semiconductor device according to claim 1; wherein the channel length of the NMOS transistor protection device is reduced smoothly in a curvilinear manner from the first end to the second end in the channel width direction.

5. A semiconductor device according to claim 1; wherein the channel length of the NMOS transistor protection device is 3.1 $\mu$m or shorter at the first end.

6. A semiconductor device according to claim 1; wherein the channel length of the NMOS transistor protection device is 1.2 $\mu$m or longer at the second end.

7. A semiconductor device according to claim 1; wherein the channel length of the NMOS transistor protection device is 1.8 $\mu$m or longer at the second end.

8. A semiconductor device according to claim 1; wherein the channel length of the NMOS transistor protection device is varied in the channel width direction based on a correlation between substrate current and source-drain parasitic resistance to avoid localization of parasitic bipolar operation along the channel width direction.

9. An NMOS protective transistor for an integrated circuit, comprising: source and drain regions; a gate electrode provided above the source and drain regions; and a channel provided between the source and drain regions below the gate electrode and having a channel length extending between the source and drain regions and a channel width extending parallel to the source and drain regions, the channel length being varied from a first end of the NMOS transistor connected to an external connection terminal of the integrated circuit and a second end opposite the first end in the channel width direction, the channel length being longest at the first end of the channel and shortest at the second end of the channel.

10. An NMOS protective transistor according to claim 9; wherein the external connection terminal is an input-output terminal.

11. An NMOS protective transistor according to claim 9; wherein the channel length is reduced in two steps from the first end to the second end in the channel width direction.

12. An NMOS protective transistor according to claim 9; wherein the channel length is reduced in three steps from the first end to the second end in the channel width direction.

13. An NMOS protective transistor according to claim 9; wherein the channel length is reduced smoothly in a curvilinear manner from the first end to the second end in the channel width direction.

14. An NMOS protective transistor according to claim 9; wherein the channel length is 3.1 $\mu$m or less at the first end.

15. An NMOS protective transistor according to claim 9; wherein the channel length is 1.2 $\mu$m or longer at the second end.

16. An NMOS protective transistor according to claim 9; wherein the channel length is 1.8 $\mu$m or longer at the second end.

17. An NMOS protective transistor according to claim 9; wherein the channel length is varied in the channel width direction to avoid localization of parasitic bipolar operation along the channel width.

18. An NMOS protective transistor according to claim 17; wherein the channel length is varied based on a correlation between substrate current and source-drain parasitic resistance.

* * * * *